(12) United States Patent
Ko et al.

(10) Patent No.: US 9,401,220 B2
(45) Date of Patent: Jul. 26, 2016

(54) MULTI-PHASE GATE DRIVER AND DISPLAY PANEL USING THE SAME

(71) Applicant: AU OPTRONICS CORP., Hsin-Chu (TW)

(72) Inventors: Chien-Chuan Ko, Hsin-Chu (TW); Meng-Chieh Tsai, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 129 days.

(21) Appl. No.: 14/564,692

(22) Filed: Dec. 9, 2014

(65) Prior Publication Data

US 2015/0332649 A1    Nov. 19, 2015

(30) Foreign Application Priority Data

May 13, 2014 (TW) .............................. 103116860 A

(51) Int. Cl.
*G11C 19/00* (2006.01)
*G11C 19/28* (2006.01)
*G09G 3/36* (2006.01)

(52) U.S. Cl.
CPC ............ *G11C 19/287* (2013.01); *G09G 3/3648* (2013.01); *G09G 3/3666* (2013.01); *G09G 3/3677* (2013.01); *G11C 19/00* (2013.01); *G09G 2300/0426* (2013.01); *G09G 2310/0286* (2013.01); *G09G 2310/08* (2013.01)

(58) Field of Classification Search
CPC ....................................................... G11C 19/00
See application file for complete search history.

(56) References Cited

U.S. PATENT DOCUMENTS

| 7,031,422 | B2 * | 4/2006 | Kawasaki | G11C 19/184 345/100 |
| 7,616,181 | B2 | 11/2009 | Kuo et al. | |
| 8,018,423 | B2 * | 9/2011 | Tsai | G09G 3/3677 345/100 |
| 8,363,777 | B2 * | 1/2013 | Lin | G09G 3/3677 377/64 |
| 2008/0001899 | A1 | 1/2008 | Chan et al. | |
| 2011/0148830 | A1 | 6/2011 | Hsu et al. | |

FOREIGN PATENT DOCUMENTS

| CN | 101777301 | 7/2010 |
| JP | 2010033690 | 2/2010 |
| TW | I343039 | 2/1996 |
| TW | I371738 | 5/1996 |
| TW | I401668 | 7/1997 |

* cited by examiner

*Primary Examiner* — Hai L Nguyen
(74) *Attorney, Agent, or Firm* — WPAT, PC; Justin King

(57) ABSTRACT

A multi-phase gate driver includes a start/end signal generator circuit and X shift register modules. The start/end signal generator circuit is configured to sequentially output N start signals and N end signals according to a first control signal, a second control signal and N groups of clock signals. Each start and end signals have a delay relative to the previous one. Each group of clock signals includes a first clock signal and a second clock signal, which are inverted to each other. The X shift register modules are electrically coupled to the start/end signal generator circuit and each includes N shift register units. The Mth shift register unit of the first shift register module outputs a gate signal according to the Mth group of clock signals, the Mth start signal, and the gate signal outputted from the Mth shift register unit in the second shift register module.

10 Claims, 4 Drawing Sheets

MULTI-PHASE GATE DRIVER AND DISPLAY PANEL USING THE SAME

TECHNICAL FIELD

The present disclosure relates to a gate driver, and more particularly to a multi-phase gate driver. The present disclosure also relates to a display panel.

BACKGROUND

Liquid crystal display (LCD) screens are widely used in electronic apparatuses and devices such as smart phones, notebook computers, desktop monitors and televisions due to having the features of high-quality image, small size and light weight; so that LCD screens have replaced the traditional cathode ray tube displays and became one of the mainstreams of display screen.

In the current LCD screen, a gate drive is directly manufactured, through multi-phase gate driver on array technology, in a peripheral area of the display panel formed by an array substrate; wherein the gate drive is used for driving a high-resolution display panel.

However, with the increasing resolution of display panel, the number of control signals required to be provided from a timing controller to the gate driver also increases; and consequentially the number of conductive lines arranged in the peripheral area of the display panel and for transmitting the control signals also increases. Thus, the display panel accordingly has a border with increasing width.

SUMMARY

An object of the present disclosure is to provide a multi-phase gate driver capable of reducing the number of conductive lines arranged in a peripheral area of a display panel.

Another object of the present disclosure is to provide a display panel adopting the aforementioned multi-phase gate driver.

The present disclosure discloses a multi-phase gate driver, which is disposed in a peripheral area of a display panel for generating a plurality of gate signals. The multi-phase gate driver includes a start/end signal generator circuit and X shift register modules. The start/end signal generator circuit is configured to sequentially output N start signals according to a first control signal and N groups of clock signals and sequentially output N end signals according to a second control signal and the N groups of clock signals. Each one of the N start signals has a delay relative to the previous start signal. Each one of the N end signals has the delay relative to the previous end signal. Each one of the N groups of clock signals includes a respective first clock signal and a respective second clock signal. The first clock signal and its respective second clock signal are inverted to each other. Each one of the N first clock signals has the delay relative to the first clock signal in the previous group. The X shift register modules are electrically coupled to the start/end signal generator circuit and each includes N shift register units arranged in sequence from top to bottom. The Mth of the N shift register units in the first of the X shift register modules is configured to output a respective gate signal according to the Mth of the N groups of clock signals, the Mth of the N start signals, and the gate signal outputted from the Mth of the N shift register units in the second of the X shift register modules. The M, N and X are positive integers and N is greater than 1.

The present disclosure further discloses a display panel, which includes at least a multi-phase gate driver disposed in a peripheral area of a display panel and for generating a plurality of gate signals. Each multi-phase gate driver includes a start/end signal generator circuit and X shift register modules. The start/end signal generator circuit is configured to sequentially output N start signals according to a first control signal and N groups of clock signals and sequentially output N end signals according to a second control signal and the N groups of clock signals. Each one of the N start signals has a delay relative to the previous start signal. Each one of the N end signals has the delay relative to the previous end signal. Each one of the N groups of clock signals includes a respective first clock signal and a respective second clock signal. The first clock signal and its respective second clock signal are inverted to each other. Each one of the N first clock signals has the delay relative to the first clock signal in the previous group. The X shift register modules are electrically coupled to the start/end signal generator circuit and each includes N shift register units arranged in sequence from top to bottom. The Mth of the N shift register units in the first of the X shift register modules is configured to output a respective gate signal according to the Mth of the N groups of clock signals, the Mth of the N start signals, and the gate signal outputted from the Mth of the N shift register units in the second of the X shift register modules. The M, N and X are positive integers and N is greater than 1.

In summary, by employing the start/end signal generator circuits to generate, according the control signals Vst, Vend outputted from the timing controller, the start signals and end signals for the multi-phase gate drivers, the timing controller only needs to output one start signal and one end signal to the multi-phase gate drivers. Thus, the number of conductive line, arranged between the timing controller and the multi-phase gate drivers and for transmitting the start and end signals, is reduced; and consequentially, the display panel has a slimmer border.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
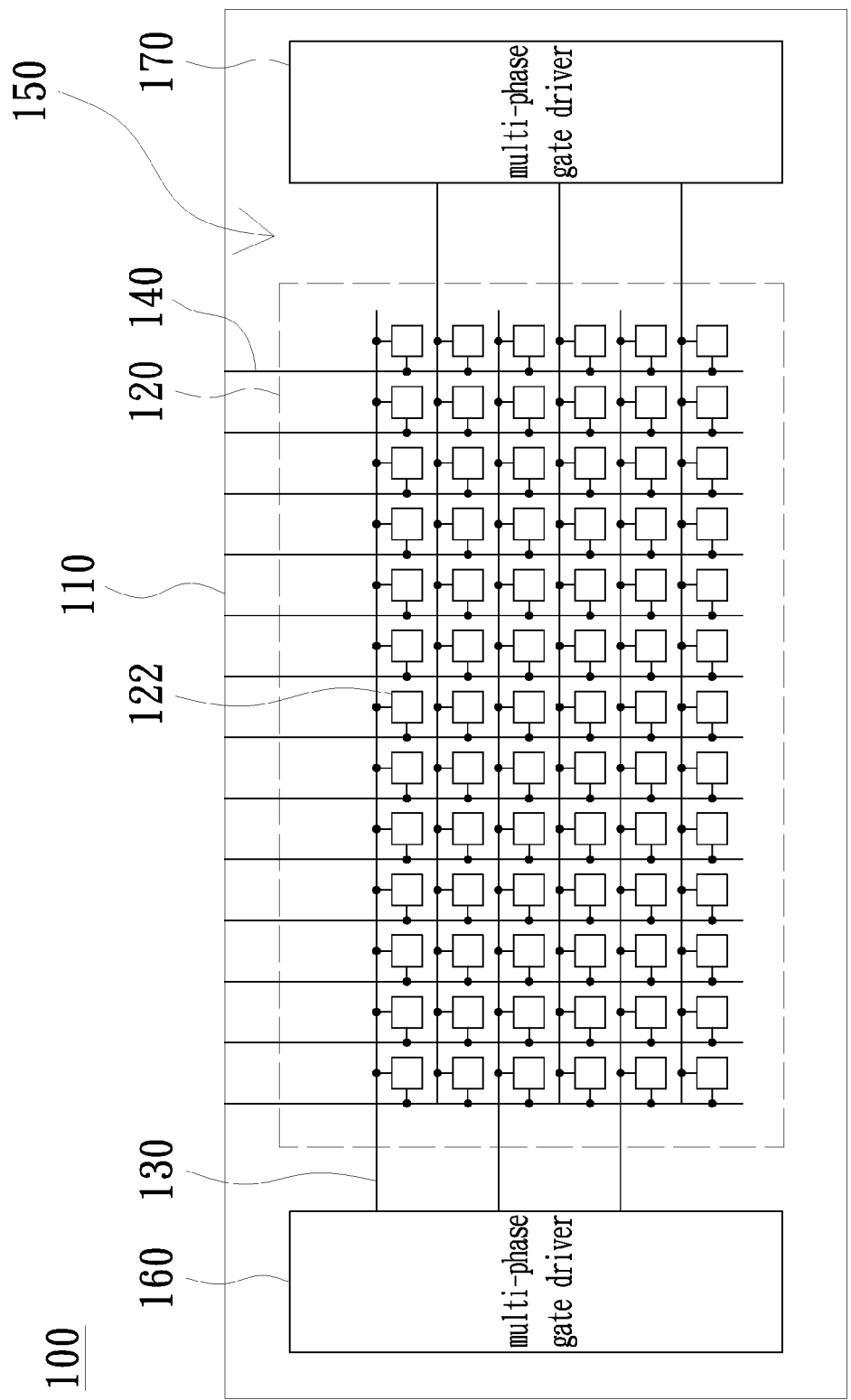
FIG. 1 is a schematic view of a display panel in accordance with an embodiment of the present disclosure.

FIG. 1 is a schematic view of a display panel in accordance with an embodiment of the present disclosure. As shown, the display panel 100 in the present embodiment is exemplified by including two multi-phase gate drivers 160, 170. The multi-phase gate drivers 160, 170 in the present embodiment are implemented by the multi-phase gate driver on array (GOA) technology. The display panel 100 further includes a substrate 110, which includes a pixel matrix 120 formed by a plurality of pixels 122. Each pixel 122 is electrically coupled to a corresponding gate line 130 and a corresponding source line 140. As shown in FIG. 1, the multi-phase gate drivers 160, 170 are directly formed in a peripheral area 150 defined on the display panel 100 formed by the substrate 110; specifically the multi-phase gate drivers 160, 170 are formed on the two opposite sides of the display panel 100. In the present embodiment, the multi-phase gate driver 160 is electrically coupled to the odd-numbered gate lines 130 and the multi-phase gate driver 170 is electrically coupled to the even-numbered gate lines 130; however, the present invention is not limited thereto. To those ordinarily skilled in the art, it is understood that when the display panel 100 is driven by more than one multi-phase gate driver, the multi-phase gate drivers are sequentially electrically coupled to the gate lines according to the sequence of the signals outputted therefrom. Both of the multi-phase gate drivers 160, 170 are electrically coupled to a timing controller (not shown), from which to receive a plurality of respective control signals and accordingly output a plurality of respective gate signals to the respective gate lines 130. The internal circuit of the multi-phase gate drivers 160, 170 (hereafter the multi-phase gate driver 160 is took as an example) in one embodiment of the present disclosure will be described in detail as follow.

Figure 2:
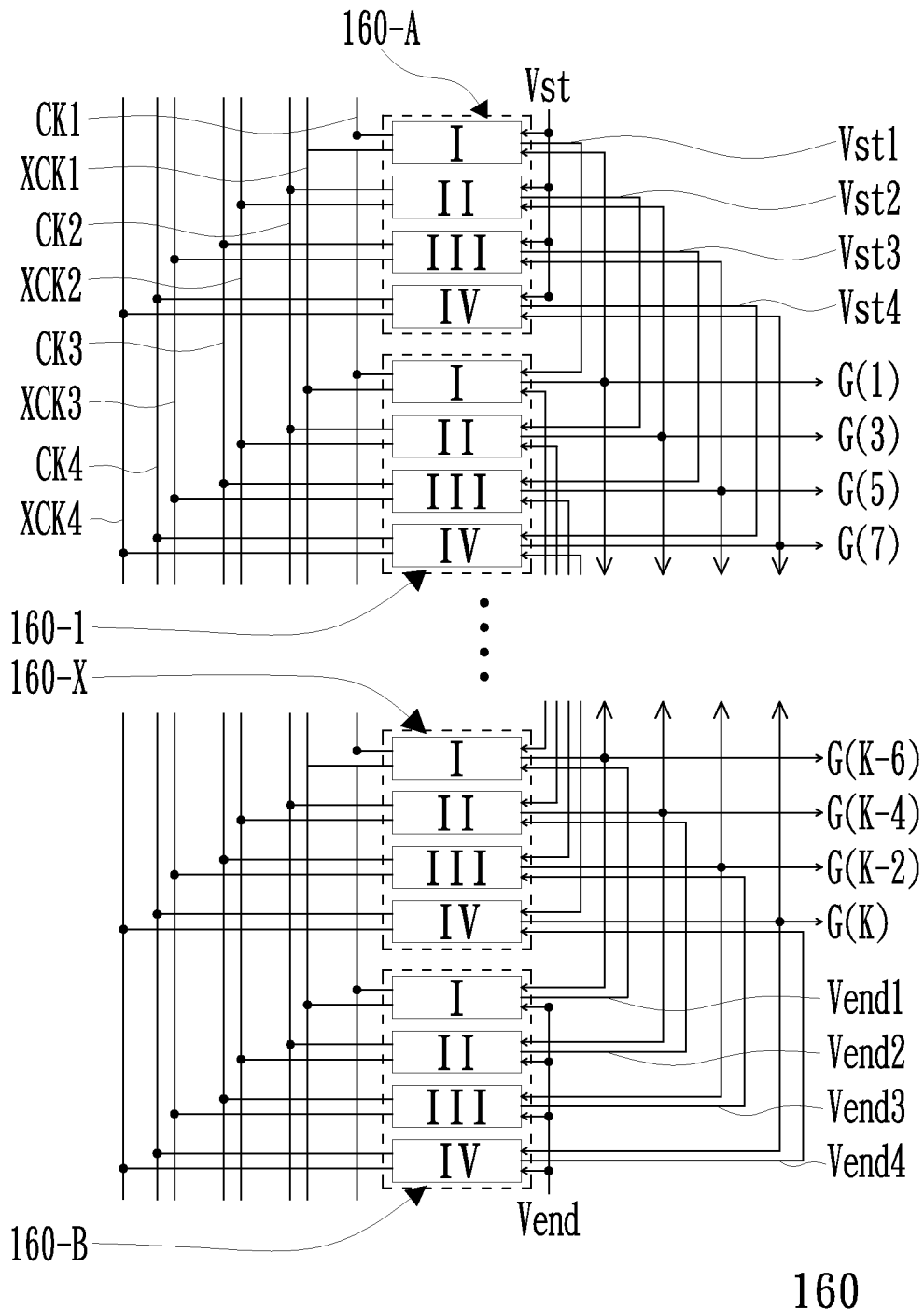
FIG. 2 is a schematic view of a multi-phase gate driver in accordance with an embodiment of the present disclosure.
Figure 3:
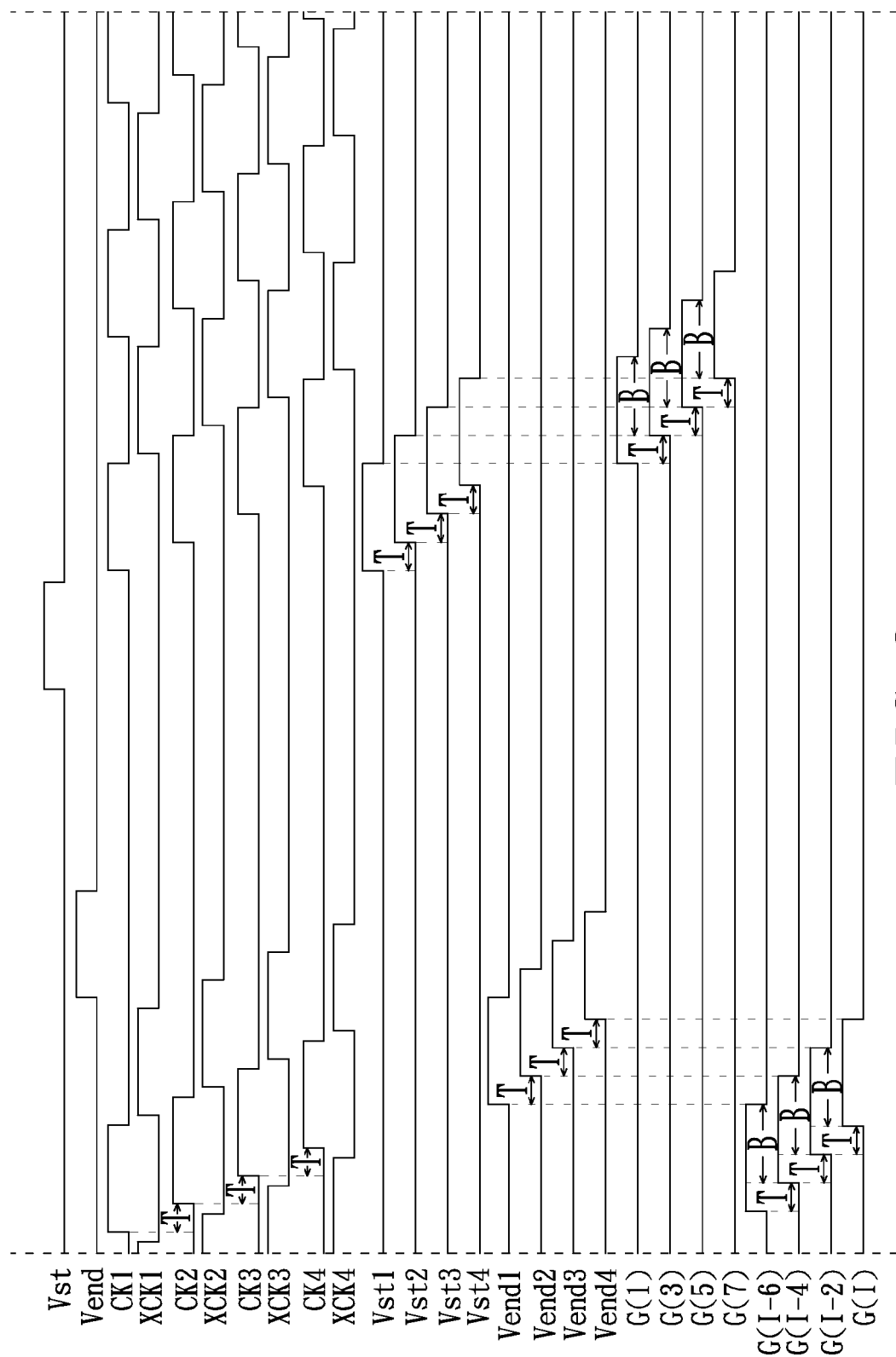
FIG. 3 is a schematic timing diagram of the signals used in the multi-phase gate driver of FIG. 2.

FIG. 2 is a schematic view of the multi-phase gate driver 160 in accordance with an embodiment of the present disclosure. FIG. 3 is a schematic timing diagram of the signals used in the multi-phase gate driver 160. Please refer to FIGS. 2, 3. As shown in FIG. 2, the multi-phase gate driver 160 includes a plurality of shift register modules 160-1~160-X and two start/end signal generator circuits 160-A, 160-B. The start/end signal generator circuit 160-A is configured to sequentially output a plurality of start signals according to the control signal Vst and a plurality of clock signals. In the present embodiment, the start/end signal generator circuit 160-A is configured to receive four groups of clock signals. The first group of clock signals consists of the clock signals CK1, XCK1; wherein the clock signals CK1, XCK1 are inverted to each other. The second group of clock signals consists of the clock signals CK2, XCK2; wherein the clock signals CK2, XCK2 are inverted to each other. The third group of clock signals consists of the clock signals CK3, XCK3; wherein the clock signals CK3, XCK3 are inverted to each other. The fourth group of clock signals consists of the clock signals CK4, XCK4; wherein the clock signals CK4, XCK4 are inverted to each other. Specifically, the clock signal CK2 has a delay T relative to the clock signal CK1; the clock signal CK3 has the delay T relative to the clock signal CK2; and the clock signal CK4 has the delay T relative to the clock signal CK3.

In the present embodiment, the start/end signal generator circuit 160-A is configured to output four start signals Vst1~Vst4. Specifically, the start signal Vst2 has the delay T relative to the start signal Vst1; the start signal Vst3 has the delay T relative to the start signal Vst2; and the start signal Vst4 has the delay T relative to the start signal Vst3. The start/end signal generator circuit 160-B is configured to sequentially output a plurality of end signals according to a control signal Vend and a plurality of clock signals. In the present embodiment, the start/end signal generator circuit 160-B is configured to sequentially output four end signals Vend1~Vend4 according to the control signal Vend and the aforementioned four groups of clock signals. Specifically, the end signal Vend2 has the delay T relative to the end signal Vend1; the end signal Vend3 has the delay T relative to the end signal Vend2; and the end signal Vend4 has the delay T relative to the end signal Vend3.

Both of the start/end signal generator circuits 160-A, 160-B include a plurality of shift register units arranged in sequence from top to bottom. In the present embodiment, specifically, both of the start/end signal generator circuits 160-A, 160-B include a first-stage shift register unit I, a second-stage shift register unit II, a third-stage shift register unit III and a fourth-stage shift register unit IV arranged in sequence from top to bottom. As shown in FIG. 2, each one of the shift register units I, II, III and IV in the start/end signal generator circuits 160-A, 160-B is configured to perform a specific operation according to a respective received group of clock signals. Specifically, each one of the shift register units I, II, III and IV in the start/end signal generator circuit 160-A is configured to output a respective start signal according to a respective group of clock signals; and each one of the shift register units I, II, III and IV in the start/end signal generator circuit 160-B is configured to output a respective end signal according to a respective group of clock signals. The start signals Vst1~Vst4 outputted from the shift register units I, II, III and IV in the start/end signal generator circuit 160-A are provided to the shift register module 160-1 thereby controlling the shift register units I, II, III and IV in the shift register module 160-1 to perform a specific operation, respectively. The end signals Vend1~Vend4 outputted from the shift register units I, II, III and IV in the start/end signal generator circuit 160-B are provided to the shift register module 160-X thereby controlling the shift register units I, II, III and IV in the shift register module 160-X to perform a specific operation, respectively.

It is to be noted that the start signals Vst1~Vst4 and the end signals Vend1~Vend4 are not directly electrically coupled to the pixels 122. In other words, the start/end signal generator circuits 160-A, 160-B are configured to output the start signals Vst1~Vst4 and the end signals Vend1~Vend4, which are directly supplied to the shift register modules 160-1, 160-X for controlling the operations of the shift register modules 160-1, 160-X, respectively.

Further, the shift register modules 160-1~160-X are electrically coupled to the start/end signal generator circuits. Each one of the shift register modules 160-1~160-X includes a first-stage shift register unit I, a second-stage shift register unit II, a third-stage shift register unit III and a fourth-stage shift register unit IV arranged in sequence from top to bottom. Specifically, the Mth-stage shift register unit in the shift register module 160-1 is configured to output a respective gate signal according to the Mth group of clock signal, the Mth start signal, and the gate signal outputted from the Mth-stage shift register unit in the next-stage shift register module; wherein M is a positive integer. For example, the first-stage shift register unit I in the shift register module 160-1 is configured to output the gate signal G(1) according to the first group of clock signal (that is, the clock signals CK1, XCK1), the first start signal Vst1, and the gate signal outputted from the first-stage shift register unit I in the shift register module 160-2. Based on the same manner, the second-stage shift register unit II in the shift register module 160-1 is configured to output the gate signal G(3) according to the second group of clock signal (that is, the clock signals CK2, XCK2), the second start signal Vst2, and the gate signal outputted from the second-stage shift register unit II in the shift register module 160-2.

In addition, the Mth-stage shift register unit in the shift register module 160-X is configured to output a respective gate signal according to the Mth group of clock signal, the Mth end signal, and the gate signal outputted from the Mth-stage shift register unit in the last-stage shift register module; wherein M is a positive integer. For example, the first-stage shift register unit I in the shift register module 160-X is configured to output the gate signal G(K−6) according to the first group of clock signal (that is, the clock signals CK1, XCK1), the end start signal Vend1, and the gate signal outputted from the first-stage shift register unit I in the shift register module 160-(X−1). Based on the same manner, the second-stage shift register unit II in the shift register module 160-X is configured to output the gate signal G(K−4) according to the second group of clock signal (that is, the clock signals CK2, XCK2), the second end signal Vend2, and the gate signal outputted from the second-stage shift register unit II in the shift register module 160-(X−1).

For each one of the shift register modules 160-2~160-(X−1), the Mth-stage shift register unit in the Pth-stage shift register module is configured to output a respective gate signal according to the Mth group of clock signal, the gate signal outputted from the Mth-stage shift register unit in the previous-stage shift register module (i.e., the (P−1)th-stage shift register module) and the gate signal outputted from the Mth-stage shift register unit in the next-stage shift register module (i.e., the (P+1)th-stage shift register module); wherein 1<P<X. In addition, each two adjacent gate signals outputted from the shift register modules 160-1~160-X may have an overlap period B, as illustrated in FIG. 3. In the present embodiment, the pulse width of the delay T is equal to the pulse width of the overlap period B; however, the present invention is not limited thereto and each two adjacent gate signals may have no overlap therebetween. In one embodiment, the overlap period B may be the pre-charge period of the pixels 122; and the delay T can prevent any two gate lines from turning on the same data voltage at the same time. The configurations of the delay T and the overlap period B are well known to those ordinarily skilled in the art, and no redundant detail is to be given herein.

In the present disclosure, because the start signals Vst1~Vst4 are generated by the start/end signal generator circuit 160-A according to the control signal Vst and the end signals Vend1~Vend4 are generated by the start/end signal generator circuit 160-B according to the control signal Vend instead of being provided from the timing controller, the number of conductive lines arranged between the timing controller and the multi-phase gate drivers 160, 170 is reduced.

Figure 4:
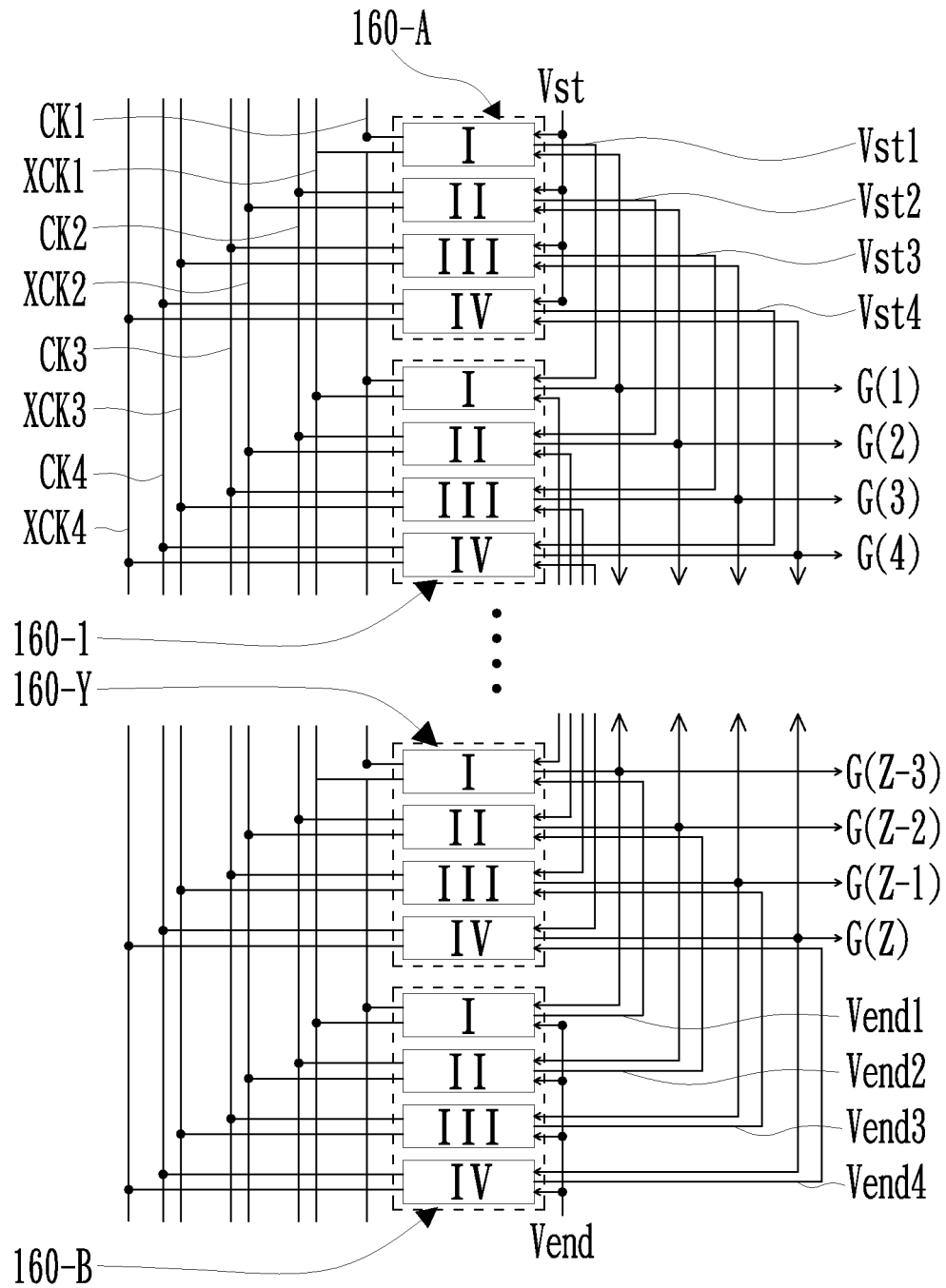
FIG. 4 is a schematic view of a multi-phase gate driver in accordance with another embodiment of the present disclosure.

The aforementioned display panel 100 is exemplified by employing two multi-phase gate drivers 160, 170; however, it is understood that the feature of the present disclosure can also apply to the display panel having one or more than two multi-phase gate drivers. FIG. 4 is a schematic view of a multi-phase gate driver in accordance with another embodiment of the present disclosure when the display panel 100 employs one multi-phase gate driver only. As shown, the main difference between the multi-phase gate driver 460 in the present embodiment as illustrated in FIG. 4 and the the multi-phase gate driver 160 in the previous embodiment as illustrated in FIG. 2 is: the multi-phase gate driver 460 in the present embodiment includes shift register modules 160-1~160-Y, which are configured to output the gate signals G(1)~G(Z) to the respective gate lines 130 of the display panel 100.

In summary, by employing the start/end signal generator circuits to generate, according the control signals Vst, Vend outputted from the timing controller, the start signals and end signals for the multi-phase gate drivers, the timing controller only needs to output one start signal and one end signal to the multi-phase gate drivers. Thus, the number of conductive line, arranged between the timing controller and the multi-phase gate drivers and for transmitting the start and end signals, is reduced; and consequentially the display panel has a slimmer border.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A multi-phase gate driver disposed in a peripheral area of a display panel for generating a plurality of gate signals, the multi-phase gate driver comprising:

a start/end signal generator circuit, configured to sequentially output N start signals according to a first control signal and N groups of clock signals and sequentially output N end signals according to a second control signal and the N groups of clock signals, wherein each one of the N start signals has a delay relative to the previous start signal, and each one of the N end signals has the delay relative to the previous end signal, each one of the N groups of clock signals comprises a respective first clock signal and a respective second clock signal, the first clock signal and its respective second clock signal are inverted to each other, each one of the N first clock signals has the delay relative to the first clock signal in the previous group; and X shift register modules, electrically coupled to the start/end signal generator circuit and each comprising N shift register units arranged in sequence from top to bottom, wherein the Mth of the N shift register units in the first of the X shift register modules is configured to output a respective gate signal according to the Mth of the N groups of clock signals, the Mth of the N start signals, and the gate signal outputted from the Mth of the N shift register units in the second of the X shift register modules, wherein M, N and X are positive integers and N is greater than 1.

2. The multi-phase gate driver according to claim 1, wherein the start/end signal generator circuit comprises a plurality of shift register units configured to sequentially output the N start signals according to the N groups of clock signals and the first control signal and sequentially output the N end signals according to the N groups of clock signals and the second control signal.

3. The multi-phase gate driver according to claim 1, wherein the Mth of the N shift register units in the last of the X shift register modules is configured to output a respective gate signal according to the Mth of the N groups of clock signals, the Mth of the N end signal, and the gate signal outputted from the Mth of the N shift register units in the (X−1)th of the X shift register modules.

4. The multi-phase gate driver according to claim 1, wherein the Mth of the N shift register units in the Pth of the X shift register modules is configured to output a respective gate signal according to the Mth of the N groups of clock signals, the Mth of the N groups of clock signals in the (P−1)th of the X shift register modules and the Mth of the N groups of clock signals in the (P+1)th of the X shift register modules, wherein 1<P<X.

5. The multi-phase gate driver according to claim 1, wherein each two adjacent gate signals of the plurality of gate signals outputted from the N shift register units have an overlap period.

6. A display panel, comprising
at least a multi-phase gate driver, disposed in a peripheral area of a display panel and for generating a plurality of gate signals, each multi-phase gate driver comprising:
a start/end signal generator circuit, configured to sequentially output N start signals according to a first control signal and N groups of clock signals and sequentially output N end signals according to a second control signal and the N groups of clock signals, wherein each one of the N start signals has a delay relative to the previous start signal, and each one of the N end signals has the delay relative to the previous end signal, each one of the N groups of clock signals comprises a respective first clock signal and a respective second clock signal, the first clock signal and its respective second clock signal are inverted to each other, each one of the N first clock signals has the delay relative to the first clock signal in the previous group; and
X shift register modules, electrically coupled to the start/end signal generator circuit and each comprising N shift register units arranged in sequence from top to bottom, wherein the Mth of the N shift register units in the first of the X shift register modules is configured to output a respective gate signal according to the Mth of the N groups of clock signals, the Mth of the N start signals, and the gate signal outputted from the Mth of the N shift register units in the second of the X shift register modules, wherein M, N and X are positive integers and N is greater than 1.

7. The display panel according to claim 6, wherein the display panel comprising two multi-phase gate drivers disposed on two opposite sides of the display panel and for outputting the gate signals.

8. The display panel according to claim 6, wherein the start/end signal generator circuit comprises a plurality of shift register units configured to sequentially output the N start signals according to the N groups of clock signals and the first control signal and sequentially output the N end signals according to the N groups of clock signals and the second control signal.

9. The display panel according to claim 6, wherein the Mth of the N shift register units in the last of the X shift register modules is configured to output a respective gate signal according to the Mth of the N groups of clock signals, the Mth of the N end signal, and the gate signal outputted from the Mth of the N shift register units in the (X−1)th of the X shift register modules.

10. The display panel according to claim 6, wherein the Mth of the N shift register units in the Pth of the X shift register modules is configured to output a respective gate signal according to the Mth of the N groups of clock signals, the Mth of the N groups of clock signals in the (P−1)th of the X shift register modules and the Mth of the N groups of clock signals of the (P+1)th of the X shift register modules, wherein $1<P<X$.

* * * * *